United States Patent [19]

Nakamura et al.

[11] Patent Number: 5,637,555
[45] Date of Patent: Jun. 10, 1997

[54] METHOD FOR MANUFACTURING A THREE-TERMINAL SUPERCONDUCTING DEVICE HAVING AN EXTREMELY SHORT SUPERCONDUCTING CHANNEL

[75] Inventors: Takao Nakamura; Hiroshi Inada; Michitomo Iiyama, all of Osaka, Japan

[73] Assignee: Sumitomo Electric Industries, Ltd., Osaka, Japan

[21] Appl. No.: 518,493

[22] Filed: Aug. 23, 1995

Related U.S. Application Data

[62] Division of Ser. No. 242,074, May 13, 1994, Pat. No. 5,471,069, which is a continuation of Ser. No. 785,324, Oct. 31, 1991, abandoned.

[30] Foreign Application Priority Data

| Oct. 31, 1990 | [JP] | Japan | 2-294287 |
| Oct. 31, 1990 | [JP] | Japan | 2-294288 |
| Oct. 31, 1990 | [JP] | Japan | 2-294289 |

[51] Int. Cl.[6] .................................. H01L 39/24
[52] U.S. Cl. .................... 505/330; 505/193; 505/234; 505/237; 505/701; 427/62; 427/63
[58] Field of Search .................................. 505/330, 193, 505/234, 237, 701; 427/62, 63; 257/39

[56] References Cited

U.S. PATENT DOCUMENTS

| 5,466,664 | 11/1995 | Inada et al. | 505/330 |
| 5,494,891 | 2/1996 | Nakamura et al. | 505/330 |

FOREIGN PATENT DOCUMENTS 2-194665  8/1990  Japan.

*Primary Examiner*—Roy V. King
*Attorney, Agent, or Firm*—Beveridge, DeGrandi, Weilacher & Young, LLP

[57] ABSTRACT

A method for manufacturing a three-terminal superconducting device is disclosed. A superconducting channel constituted in an oxide superconductor thin film is deposited on a deposition surface of a substrate. A gate electrode for the device is formed through a gate insulator layer on the superconducting channel of the device. The steps of forming the gate electrode include forming a thin film that stands upright with respect to the insulator layer for the gate.

3 Claims, 12 Drawing Sheets

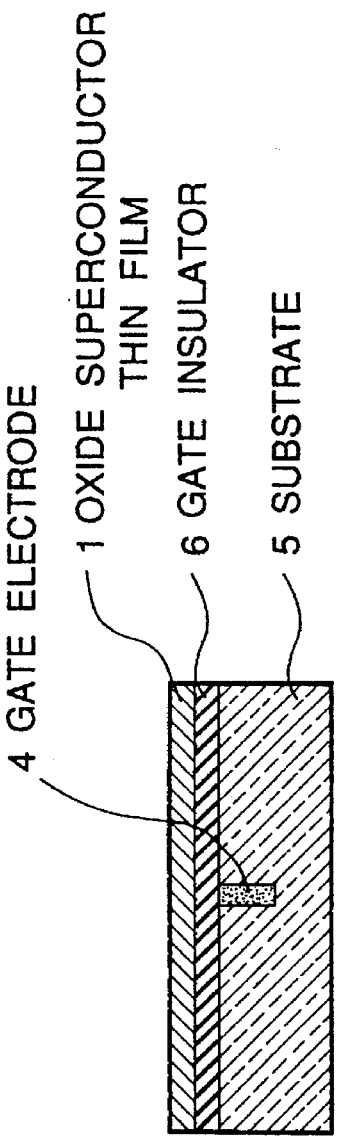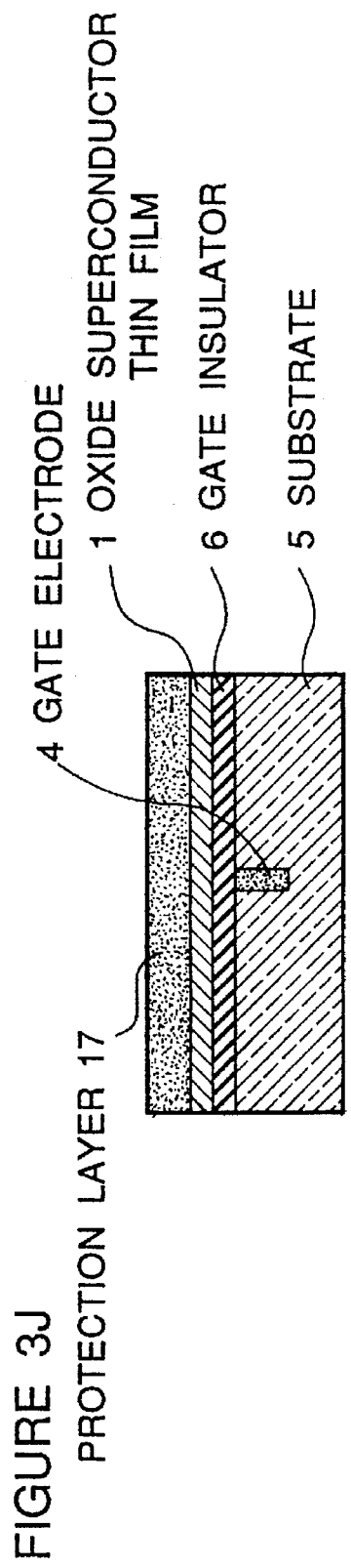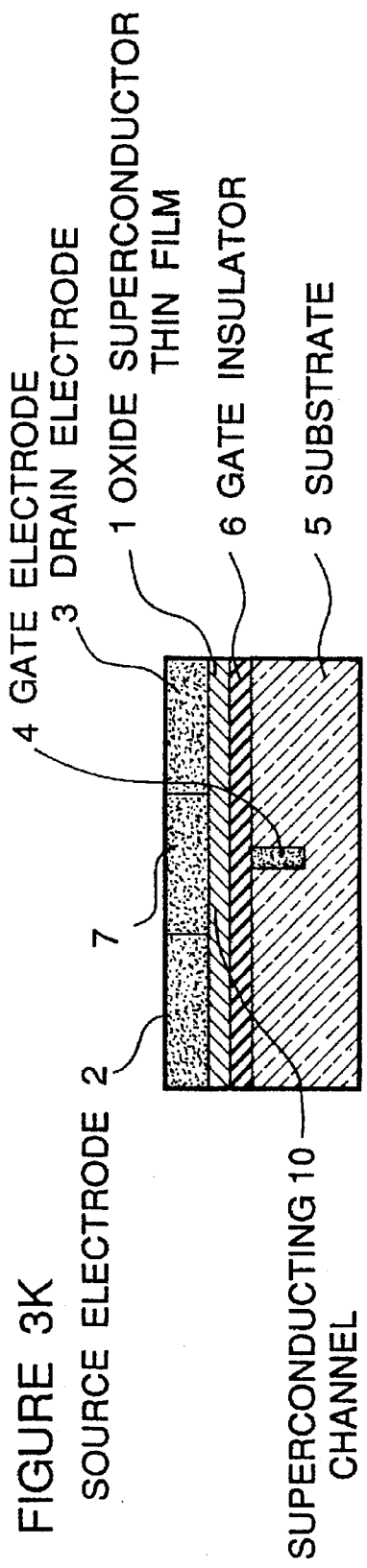
FIGURE 3I
FIGURE 3J
FIGURE 3K

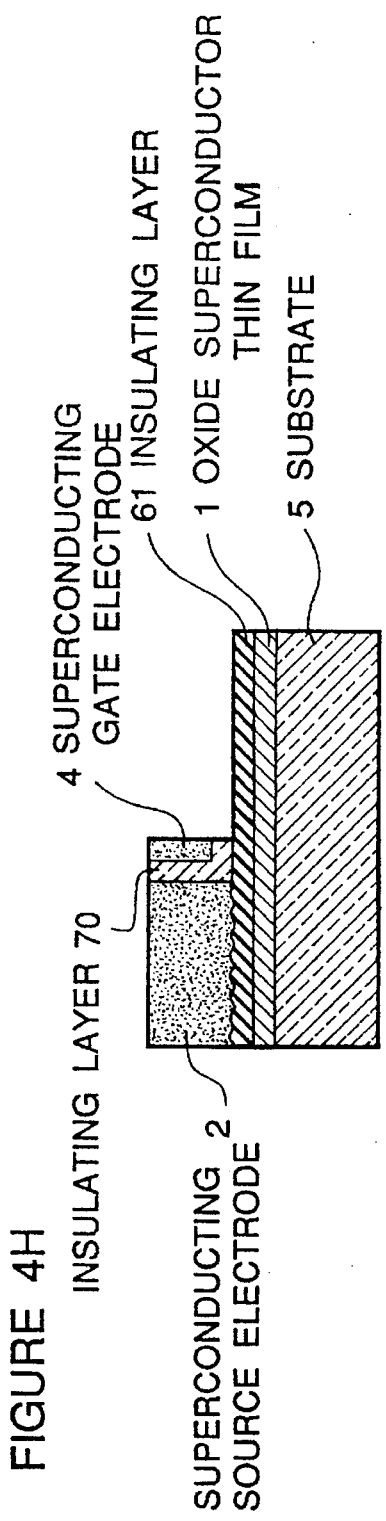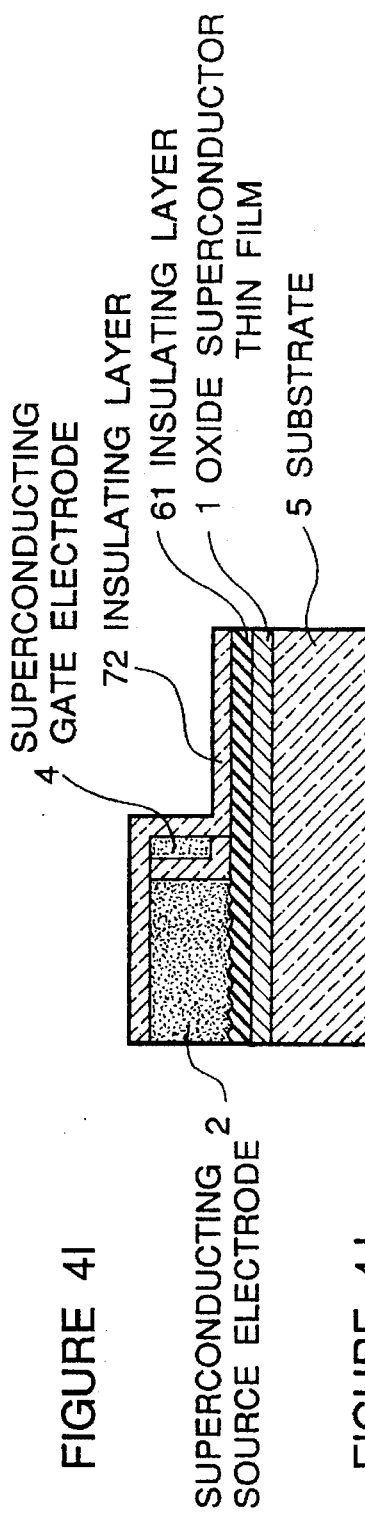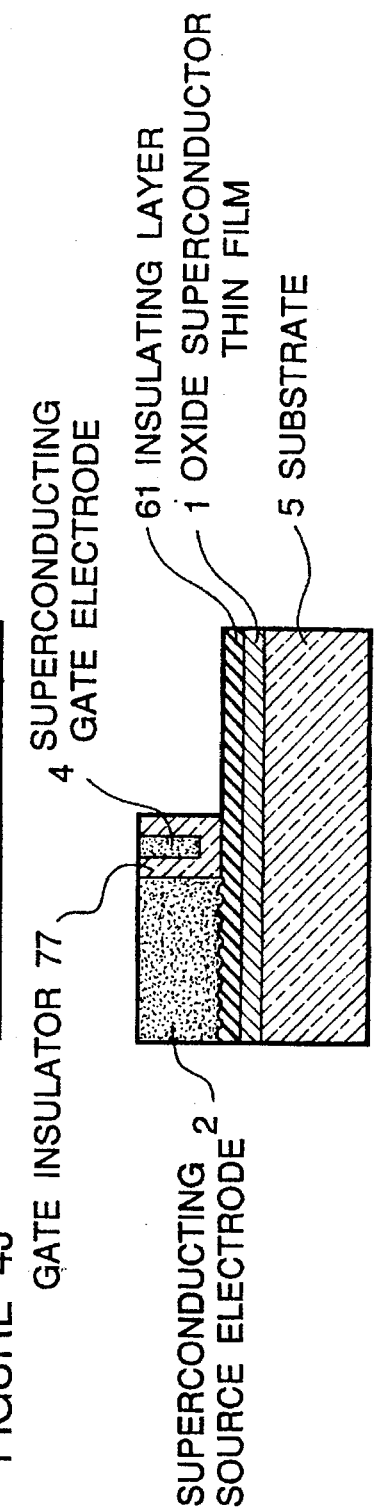

METHOD FOR MANUFACTURING A THREE-TERMINAL SUPERCONDUCTING DEVICE HAVING AN EXTREMELY SHORT SUPERCONDUCTING CHANNEL

This is a divisional of allowed application Ser. No. 08/242,074 filed on May 13, 1994, now U.S. Pat. No. 5,471,069, which is a continuation of application Ser. No. 07/785,324 filed on Oct. 31, 1991 (now abandoned).

BACKGROUND OF THE INVENTION

1. Field of the Invention

The present invention relates to a superconducting device and a method for manufacturing the same, and more specifically to a superconducting device including an extremely thin superconducting channel formed of oxide superconductor material, and a method for manufacturing the same.

2. Description of Related Art

Typical devices utilizing a superconductor include a so called Josephson device, which comprises a pair of superconductors coupled to each other through a tunnel barrier. The Josephson device can realize a high speed switching. However, the Josephson device is a two-terminal device, and therefore, requires a complicated circuit in order to realize a logic circuit.

On the other hand, typical three-terminal devices utilizing a superconductor include a so called superconducting-base transistor and a so called super-FET (field effect transistor). The superconducting-base transistor includes an emitter of a superconductor or a normal conductor, a tunnel barrier of an insulator, a base of a superconductor, a semiconductor isolator and a collector of a normal conductor, stacked in the named order. This superconducting-base transistor operates at a high speed with a low power consumption, by utilizing high speed electrons passing through the tunnel barrier.

The super-FET includes a semiconductor layer, and a superconductor source electrode and a superconductor drain electrode which are formed closely to each other on the semiconductor layer. A portion of the semiconductor layer between the superconductor source electrode and the superconductor drain electrode has a greatly recessed or undercut rear surface so as to have a reduced thickness. In addition, a gate electrode is formed through a gate insulating layer on the recessed or undercut rear surface of the portion of the semiconductor layer between the superconductor source electrode and the superconductor drain electrode.

A superconducting current flowing through the semiconductor layer portion between the superconductor source electrode and the superconductor drain electrode due to a superconducting proximity effect, is controlled by an applied gate voltage. This super-FET also operates at a high speed with a low power consumption.

In addition, in the prior art, there has been proposed a three-terminal superconducting device having a channel of a superconductor formed between a source electrode and a drain electrode, so that a current flowing through the superconducting channel is controlled by a voltage applied to a gate formed above the superconducting channel.

Both of the above mentioned superconducting-base transistor and the super-FET have a portion in which a semiconductor layer and a superconducting layer are stacked to each other. However, it is difficult to form a stacked structure of the semiconductor layer and the superconducting layer formed of an oxide superconductor which has recently advanced in study. In addition, even if it is possible to form a stacked structure of the semiconductor layer and the oxide superconducting layer, it is difficult to control a boundary between the semiconductor layer and the oxide superconducting layer. Therefore, a satisfactory operation could not been obtained in these superconducting devices.

In addition, since the super-FET utilizes the superconducting proximity effect, the superconductor source electrode and the superconductor drain electrode have to be located close to each other at a distance which is not greater than a few times the coherence length of the superconductor materials of the superconductor source electrode and the superconductor drain electrode. In particular, since an oxide superconductor has a short coherence length, if the superconductor source electrode and the superconductor drain electrode are formed of the oxide superconductor material, a distance between the superconductor source electrode and the superconductor drain electrode has to be not greater than a few ten nanometers. However, it is very difficult to conduct a fine processing such as a fine pattern etching so as to ensure the very short separation distance. Because of this, in the prior art, it has been impossible to manufacture the super-FET composed of the oxide superconductor material with good reproducibility.

Furthermore, it has been confirmed that the conventional three-terminal superconducting device having the superconducting channel shows a modulation operation. However, the conventional three-terminal superconducting device having the superconducting channel could not realize a complete ON/OFF operation, because a carrier density is too high. In this connection, since an oxide superconductor material has a low carrier density, it is expected to form a three-terminal superconducting device which has a superconducting channel and which can realize the complete ON/OFF operation, by forming the superconducting channel of the oxide superconductor material. In this case, however, a thickness of the superconducting channel has to be made on the order of five nanometers. This extremely thin superconducting channel is difficult to realize.

On the other hand, in order to realize a high speed ON/OFF operation in the above mentioned superconducting device, it is necessary to shorten a gate length. In order to shorten the gate length, the gate electrode has to have a shape which is short in a direction of a current flowing through the superconducting channel, for example, not greater than 100 nm. It is practically very difficult to form the gate electrode having the above mentioned size on the oxide superconductor by a conventional fine-working (fine-etching) technique with good reproducibility.

SUMMARY OF THE INVENTION

Accordingly, it is an object of the present invention to provide a superconducting device and a method for manufacturing the same, which have overcome the above mentioned defects of the conventional ones.

Another object of the present invention is to provide a superconducting device including a superconducting region constituted of an extremely thin oxide superconductor film, which can be manufactured by using existing established processing techniques with a good repeatability.

Still another object of the present invention is to provide an FET type superconducting device including an extremely short superconducting channel composed of an oxide superconductor thin film, and a method for manufacturing the same with a good repeatability by using existing established processing techniques.

The above and other objects of the present invention are achieved in accordance with the present invention by a superconducting device comprising a substrate, a superconducting channel constituted in an oxide superconductor thin film deposited on a deposition surface of the substrate, a source electrode and a drain electrode formed on the oxide superconductor thin film at opposite ends of the superconducting channel, so that a superconducting current can flow through the superconducting channel between the superconductor source electrode and the superconductor drain electrode, and a gate electrode formed through a gate insulator layer on the superconducting channel so as to control the superconducting current flowing through the superconducting channel, the gate electrode being in the form of a thin film standing upright to the gate insulator layer.

In one embodiment, the superconducting channel has a thickness of not greater than five nanometers, and the oxide superconductor thin film has an upper planar surface. The gate insulator layer is deposited on the upper planar surface of the oxide superconductor thin film, and an insulating protection layer is formed on the gate insulator layer and having an end surface angled to the gate insulator layer. The gate electrode is formed of a thin film of a normal conductor deposited on the end surface of the insulating protection layer.

The above mentioned superconducting device can be formed in accordance with a method of the present invention, by forming on a substrate an oxide superconductor thin film having a planar upper surface and a superconducting region having a thickness of not greater than five nanometers, depositing a gate insulator layer on the planar upper surface of the oxide superconductor thin film, forming a plurality of insulating protection layers on the gate insulator layer in such a manner that a selected one of the insulating protection layers has an end surface positioned above the superconducting region having the thickness of not greater than five nanometers, and forming a gate electrode in the form of a thin film on the end surface of the selected insulating protection layer.

In another embodiment, the gate electrode being in the form of a thin film is embedded in the substrate. This gate electrode in the form of a thin film and embedded in the substrate can be formed by depositing an oxide superconductor thin film on an insulating substrate having a stepped portion or a semiconductor substrate having a stepped portion and coated with an insulating layer, selectively removing the deposited oxide superconductor thin film from the substrate so as to leave the deposited oxide superconductor thin film on only the side surface of the stepped portion, and filling a material (for example, the same material as that of the substrate) into a recess formed by the stepped portion.

In still another embodiment, the gate electrode being in the form of a thin film is located on the substrate, and the source electrode and the drain electrode are formed of an oxide superconducting source electrode and an oxide superconducting drain electrode, respectively, which are located on the oxide superconductor thin film of the superconducting channel through an extremely thin insulator layer. Flocculation occurs in the extremely thin insulator layer sandwiched between the oxide superconductor thin film of the superconducting channel and each of the oxide superconducting source electrode and the oxide superconducting drain electrode, so that the superconducting source electrode and the superconducting drain electrode are in electrical connection with the oxide superconductor thin film of the superconducting channel.

In this embodiment, the oxide superconductor thin film of the superconducting channel is formed of a c-axis oriented oxide superconductor crystal layer formed on the substrate, and the superconducting source electrode, the superconducting gate electrode and the superconducting drain electrode are formed of an a-axis oriented oxide superconductor crystal layer foraged on the extremely thin insulator layer.

As seen from the above, the superconducting device in accordance with the present invention includes the superconducting channel formed of the oxide superconductor thin film, the source electrode and the drain electrode for causing a current to flow through the superconducting channel, and the gate electrode for controlling the current flowing through the superconducting channel. Here, each of the three electrodes must be not necessarily constituted of a superconducting electrode.

As mentioned above, in the superconducting device in accordance with the present invention, the superconducting channel is constituted of a portion of the oxide superconductor thin film having the planar upper surface. In order to turn on and off the gate (namely, the superconducting channel) by a voltage applied to the gate electrode, the thickness of the superconducting channel in a direction of an electric field created by the gate electrode must be not greater than five nanometers. Such an extremely thin oxide superconductor thin film can be formed in a conventional process by precisely controlling the growth speed and the growth time of the thin film. For this purpose, a sputtering can be used. However, since the oxide superconductor crystal has a multi-layer structure in which respective constituent elements are stacked in a layered structure, it is possible to stack a desired number of unit cells of oxide superconductor, by using a MBE (molecular beam epitaxy).

In the superconducting channel-FET having a channel formed of an oxide superconductor thin film, only a portion of the oxide superconductor thin film subjected to an electric field given by an applied gate voltage can flow and block an electric current. Therefore, the channel length is substantially determined by the gate length of the gate electrode. The gate length is a length of the gate electrode in a direction of a current flowing through the superconducting channel. Namely, in the superconducting device in accordance with the present invention, since the extremely thin gate electrode stands upright on the superconducting channel through the gate insulator layer, the gate length of the gate electrode is substantially determined by the thickness of the oxide superconductor thin film of the gate electrode. Preferably, the gate electrode has a thickness of not greater than 100 nm. In any case, the thinner the gate electrode (in the form of a thin film) becomes, the shorter the gate length becomes. Accordingly, in the superconducting device in accordance with the present invention, an extremely short gate length and hence a corresponding extremely short superconducting channel can be realized by this extremely thin gate electrode, so that the ON/OFF operation can be speeded up.

As mentioned above, only the portion of the oxide superconductor thin film superconducting channel layer subjected to an electric field given by an applied gate voltage constitutes the superconducting channel which can flow and block an electric current. Namely, the other portion of the oxide superconductor thin film superconducting channel layer does not contribute ON/OFF of the current, and therefore, it can be understood that, a portion of the oxide superconductor thin film superconducting channel layer that does not contribute ON/OFF of the current, is a portion of a source electrode or a drain electrode. In this specification, therefore, the source electrode should be understood to include not only an electrode corresponding to the electrode which is called a "source electrode" in the field of a semiconductor MOSFET, but also a source region which is formed adjacent to and continuous to the superconducting channel and on which the source electrode is formed, and the drain electrode should be understood to include not only an electrode corresponding to the electrode which is called a "drain electrode" in the field of the semiconductor MOSFET, but also a drain region which is formed adjacent to and continuous to the superconducting channel and on which the drain electrode is formed.

As mentioned above, the thin film of the gate electrode is provided on the end surface of the insulating protection layer. Therefore, it is possible to easily form the thin film of the gate electrode on the end surface of the insulating protection layer, by depositing a conductive material onto the end surface of the insulating protection layer. Accordingly, the superconducting device in accordance with the present invention can have the above mentioned shortened gate without using the fine-processing technique.

In the superconducting device in accordance with the present invention, the above mentioned extremely thin superconducting channel is realized as follows:

(1) Components of the substrate are selectively diffused into the oxide superconductor layer deposited on the substrate, so that a non-superconducting region is formed in the oxide superconductor thin film. The non-superconducting region thus formed in the oxide superconductor thin film acts to thin a superconducting portion of the oxide superconductor thin film.

(2) A projection is previously formed on the substrate, and an oxide superconductor thin film having a planar upper surface is formed to cover the projection of the substrate. As a result, an extremely thin portion of the oxide superconductor thin film is formed above the projection of the substrate.

In the former case, constituent element(s) of the substrate can be diffused into the oxide superconductor thin film. Otherwise, a portion of the substrate surface can be previously provided with a layer or island of a material which diffuses into an oxide superconductor thin film in the course of the deposition of the oxide superconductor thin film so as to destroy superconductivity in a diffused portion of the deposited oxide superconductor thin film. In order to cause the constituent element(s) of the substrate to diffuse into the oxide superconductor thin film, energy is locally applied to a position of the oxide superconductor thin film where the superconducting channel is to be formed, by a focused ion beam, a laser, or the like, so that the constituent element(s) of a substrate portion under the superconducting channel forming position of the oxide superconductor thin film is caused to diffuse into the oxide superconductor thin film.

In general, the oxide superconductor has large crystalline inhomogeneity. In particular, the critical current density is larger in directions perpendicular to the c-axis, than in a direction parallel to the c-axis. Therefore, if a superconducting source electrode and a superconducting drain electrode have been formed of c-axis oriented oxide superconductor thin films, it has been difficult to cause a superconducting current to uniformly flow through an extremely thin superconducting channel of an oxide superconductor. As mentioned above, in the superconducting device in accordance with the present invention, since the superconducting source electrode and the superconducting drain electrode are formed of an a-axis oriented oxide superconductor thin film, the main current is allowed to flow within the superconducting source electrode and the superconducting drain electrode in a direction perpendicular to the substrate. On the other hand, since the superconducting channel is formed of a c-axis oriented oxide superconductor thin film, the main current is allowed to flow within the superconducting channel in a direction parallel to the substrate. Therefore, in each of the superconducting source electrode, the superconducting drain electrode and the superconducting channel, the main current is caused to flow in a direction having a large critical current density of the oxide superconductor crystal.

The c-axis oriented oxide superconductor thin film superconducting channel can be easily formed by maintaining the substrate at a temperature of about 700° C. when the oxide superconductor thin film is deposited. On the other hand, the a-axis oriented oxide superconductor thin film superconductor source electrode and superconductor drain electrode can be easily formed by maintaining the substrate at a temperature of not greater than about 650° C. when the oxide superconductor thin film is deposited. In any case, the oxide superconductor thin film can be deposited by a sputtering such as an off-axis sputtering, a reactive evaporation, an MBE (molecular beam epitaxy), a vacuum evaporation, a CVD (chemical vapor deposition), etc.

In a preferred embodiment of the superconducting device in accordance with the present invention, the oxide superconductor thin films is formed of a high-Tc (high critical temperature) oxide superconductor material. This high-Tc oxide superconductor material has been studied by many researchers since the discovery of Bednorz and Müller in 1986, and is said to indicate an oxide superconductor material having a critical temperature of not less than 30K. More specifically, the oxide superconductor thin film is formed of a high-Tc copper-oxide type oxide superconductor material typified by a Y-Ba-Cu-O type compound oxide superconductor material, a Bi-Sr-Ca-Cu-O type compound oxide superconductor material, and a Tl-Ba-Ca-Cu-O type compound oxide superconductor material.

In addition, the substrate, on which the oxide superconductor thin film is deposited, can be formed of an insulating substrate, preferably an oxide single crystalline substrate such as MgO, $SrTiO_3$, and $CdNdAlO_4$. These substrate materials are very effective in forming or growing a crystalline film having a high orientation property. However, the superconducting device can be formed on a semiconductor substrate if an appropriate buffer layer is deposited thereon. For example, the buffer layer on the semiconductor substrate can be formed of a double-layer coating formed of a $MgAl_2O_4$ layer and a $BaTiO_3$ layer, or a single layer of "YSZ" (yttrium stabilized zirconia) or $Y_2O_3$ if a silicon substrate is used.

The above and other objects, features and advantages of the present invention will be apparent from the following description of preferred embodiments of the invention with reference to the accompanying drawings.

BRIEF DESCRIPTION OF THE DRAWINGS

FIG. 3A, 3B, 3C, 3D, 3E, 3F, 3G, 3H, 3I, 3J and 3K are diagrammatic sectional views illustrating an embodiment of the process for manufacturing a second embodiment of the superconducting device in accordance with the present invention; and FIG. 4A, 4B, 4C, 4D, 4E, 4F, 4G, 4H, 4I, 4J, 4K and 4L are diagrammatic sectional views illustrating an embodiment of the process for manufacturing a third embodiment of the superconducting device in accordance with the present invention.

DESCRIPTION OF THE PREFERRED EMBODIMENTS

Embodiment 1

Figure 1A:
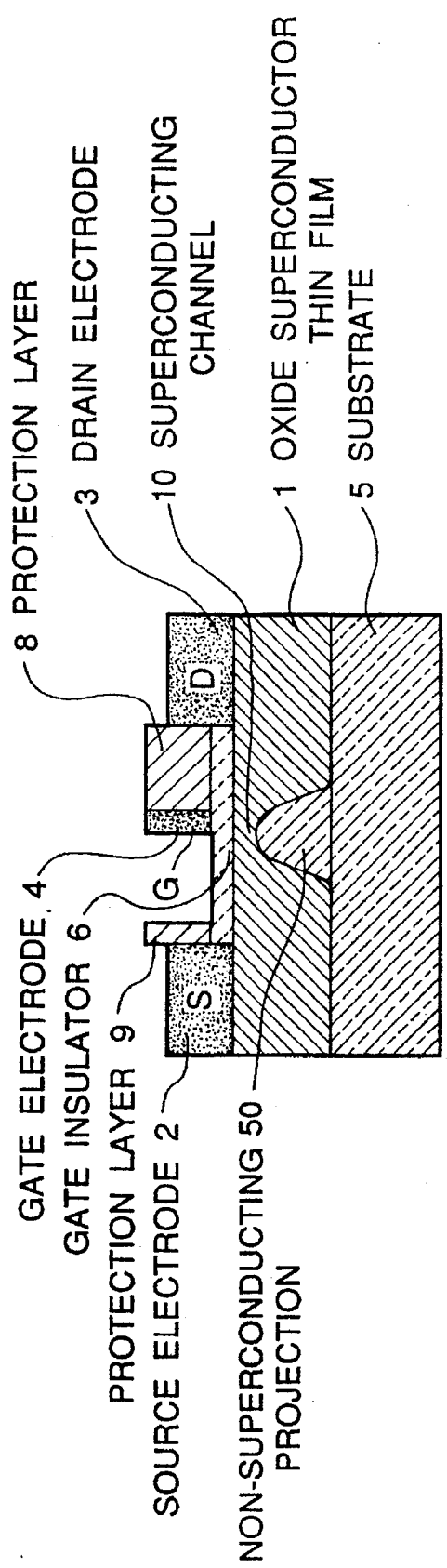
FIGS. 1A and 1B are diagrammatic sectional views of embodiments of the superconducting device in accordance with the present invention.
Figure 1B:
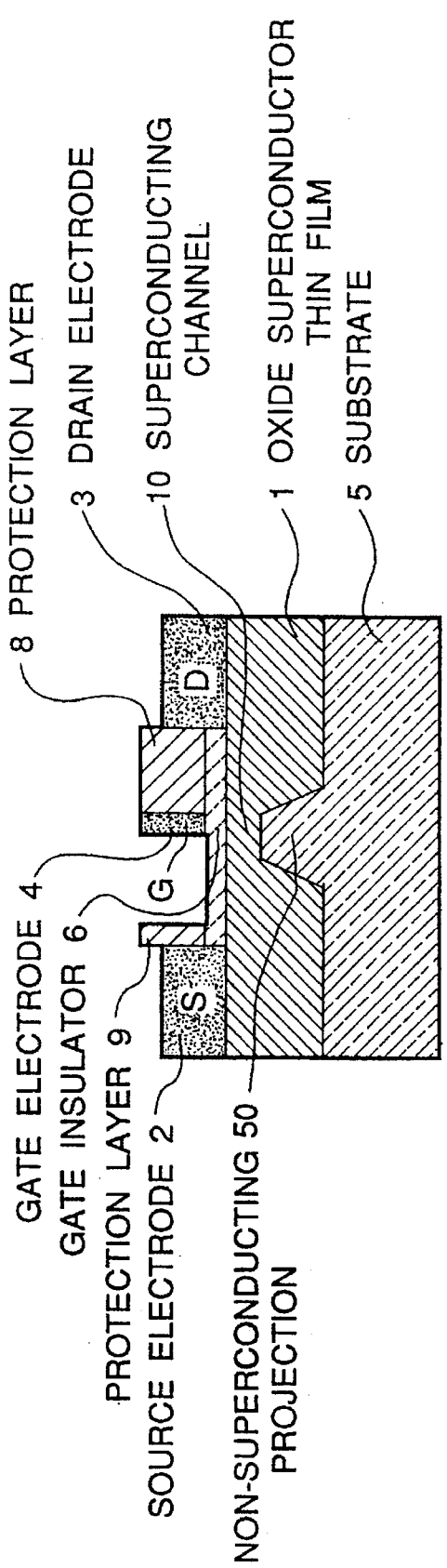

Referring to FIGS. 1A and 1B, there are shown diagrammatic sectional views of two embodiments of the superconducting devices in accordance with the present invention. In these Figures, elements similar to each other are given the same Reference Numerals.

The superconducting device shown in FIG. 1 includes an oxide superconductor thin film 1 formed on a substrate 5 and having a non-superconducting region 50 which is formed by diffusion of constituent element(s) into the oxide superconductor thin film and which no longer has superconductivity. The oxide superconductor thin film forms a superconducting channel 10 of about five nanometers in thickness at a position above the non-superconducting region 50. On the superconducting channel 10, an extremely thin gate electrode 4 is provided through a gate insulator layer 6. A source electrode 2 and a drain electrode 3 are located on the oxide superconductor thin film 1 at opposite sides of the superconducting channel 10, respectively.

The gate electrode 4 is formed of a normal conductor thin film or an oxide superconductor thin film, and is deposited on a side surface of a surface protection layer 8 formed on the gate insulator 6. The normal conductor thin film can be deposited on the side surface of the surface protection layer 8 by for example an inclined evaporation process. The oxide superconductor thin film can be deposited on the side surface of the surface protection layer 8 by for example an off-axis sputtering. As seen from the drawing, the thin film of the gate electrode 4 stands upright on the gate insulator, and therefore, the thickness of the thin film of the gate electrode 4 determines a gate length.

The embodiment shown in FIG. 1B is different from the embodiment shown in FIG. 1A, only in that the non-superconducting region 50 is constituted of a projection previously formed on the substrate 5. The other features of the embodiment shown in FIG. 1B are completely the same as those of the embodiment shown in FIG. 1A, and therefore, further explanation will be omitted.

Now, a process for manufacturing the superconducting device shown in FIG. 1A will be described with reference to FIGS. 2A to 2G.

Figure 2A:
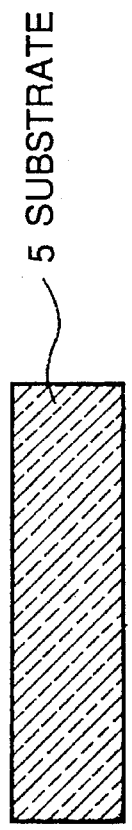
FIG. 2A, 2B, 2C, 2BB, 2CC, 2D, 2E, 2F and 2G are diagrammatic sectional views illustrating an embodiment of the process for manufacturing the superconducting devices shown in FIG. 1A and 1B.

First, a substrate 5 is prepared as shown in FIG. 2A. This substrate 5 is formed of for example, an insulating substrate such as a MgO (100) substrate, a $SrTiO_3$ (100) substrate or others, or a semiconductor substrate such as a silicon (100) substrate having a principal surface coated with insulating films. However, if the silicon substrate is used, a principal surface of the silicon substrate is continuously coated with $MgAl_2O_4$ by a CVD process and with $BaTiO_3$ by a sputtering process.

Figure 2B:
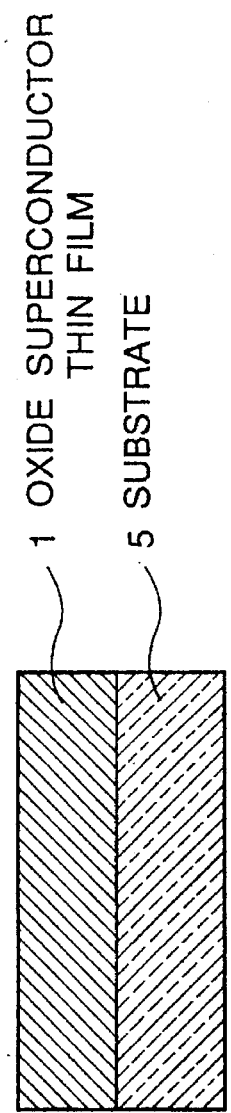

Then, as shown in FIG. 2B, an oxide superconductor thin film 1 having a thickness on the order of 200 nm to 300 nm is deposited on the substrate 5, by for example an off-axis sputtering, a reactive evaporation, an MBE (molecular beam epitaxy), a CVD, etc. The oxide superconductor material is preferably formed of, for example, a Y-Ba-Cu-O type compound oxide superconductor material, a Bi-Sr-Ca-Cu-O type compound oxide superconductor material, and a Tl-Ba-Ca-Cu-O type compound oxide superconductor material. The oxide superconductor thin film is preferably formed of a c-axis orientated oxide superconductor thin film, since the c-axis orientated oxide superconductor thin film has a large critical current density in a direction parallel to the substrate. The c-axis orientated oxide superconductor thin film can be formed by maintaining the substrate temperature at about 700° C. in a film deposition process.

Figure 2C:
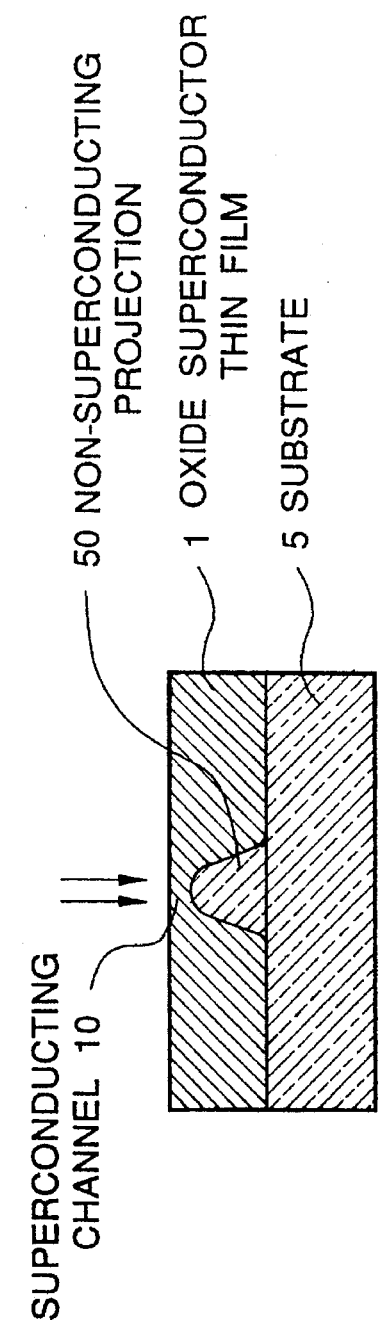
Figure 2B:
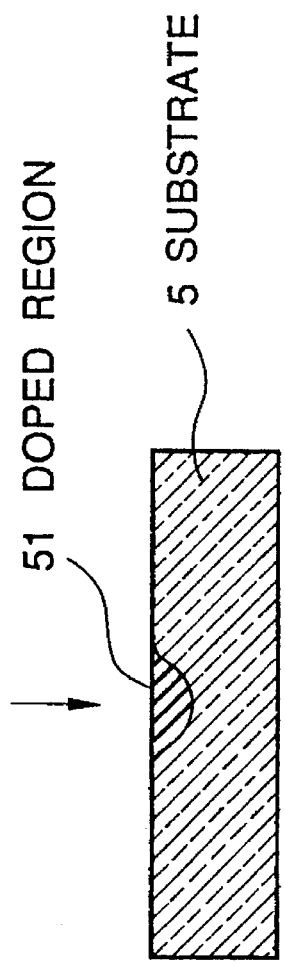
Figure 2C:
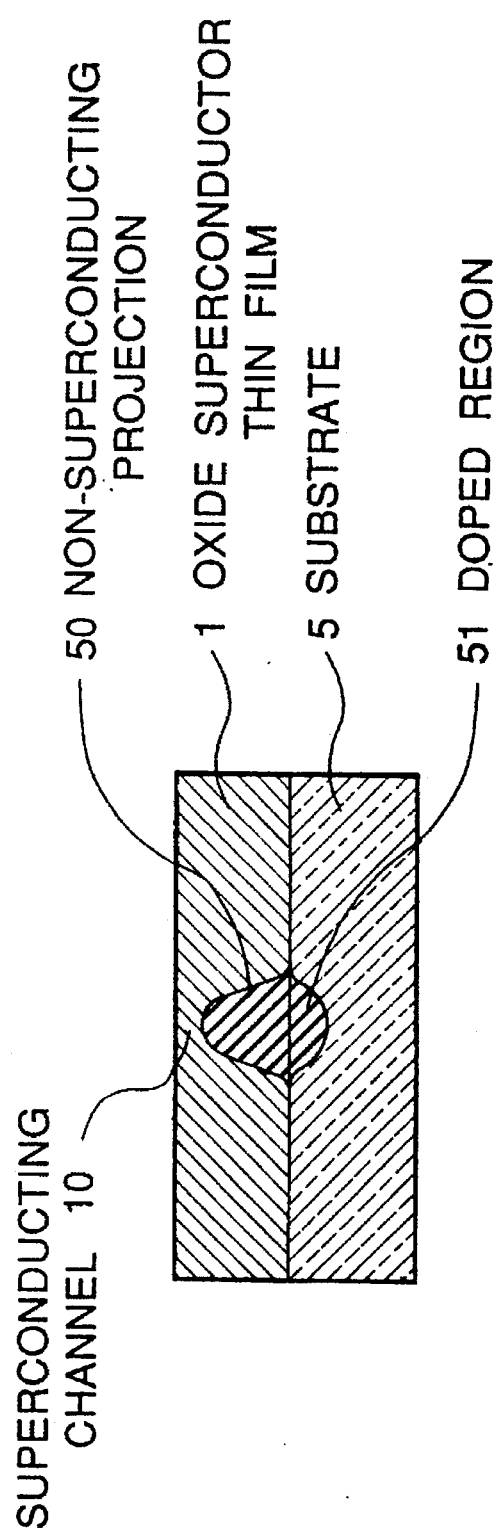

Next, a laser beam or a focused ion beam is locally irradiated onto the oxide superconductor thin film 1, as shown by arrows in FIG. 2C, so that constituent element(s) of the substrate 5 is caused to diffuse into the oxide superconductor thin film 1 so as to form the non-superconducting region 50. A portion of the oxide superconductor thin film remaining above the non-superconducting region 50 forms the superconducting channel 10.

In the case of forming the non-superconducting region 50 by irradiating the laser beam, it is preferable to use a high power laser beam such as an excimer laser, a $CO_2$ laser, a YAG laser, etc. For example, when an Ar laser having a wavelength of 514 nm is used, it is preferred to scan the laser beam having an irradiation output power of 2.0 W at a speed of 100 μm/second. On the other hand, in the case of forming the non-superconducting region 50 by irradiating the focused ion beam, it is preferred to irradiate Ar ions with a beam diameter of not greater than 0.2 μm and an acceleration voltage of not greater than 50 KV.

Here, the process shown in FIGS. 2B and 2C can be replaced by a process illustrated in FIGS. 2BB and 2CC.

Namely, as shown in FIG. 2BB, an focused ion beam is locally irradiated onto the substrate 5 so as to form a doped region 51. The irradiated ions preferably are Ba ions, Y ions, or Cu ions. In addition, it is also preferred that the beam diameter is 0.2 μm and the acceleration voltage is 50 KV. The doped region 51 having a width of not greater than 1 μm is formed on the principal surface of the substrate 5 by irradiation of the focused ion beam.

Thereafter, as shown in FIG. 2CC, the oxide superconductor thin film 1 is deposited on the substrate 5 having the doped region 51, by for example the off-axis sputtering, the reactive evaporation, the MBE, the CVD, etc., similarly to the process of FIG. 2C. In the process of growth of the oxide superconductor thin film 1 on the substrate 5, doped elements are diffused from the doped region 51 into the oxide superconductor thin film 1 so as to form the non-superconducting region 50. A superconducting portion of the oxide superconductor thin film remaining above the non-superconducting region 50 forms the superconducting channel 10.

Figure 2D:
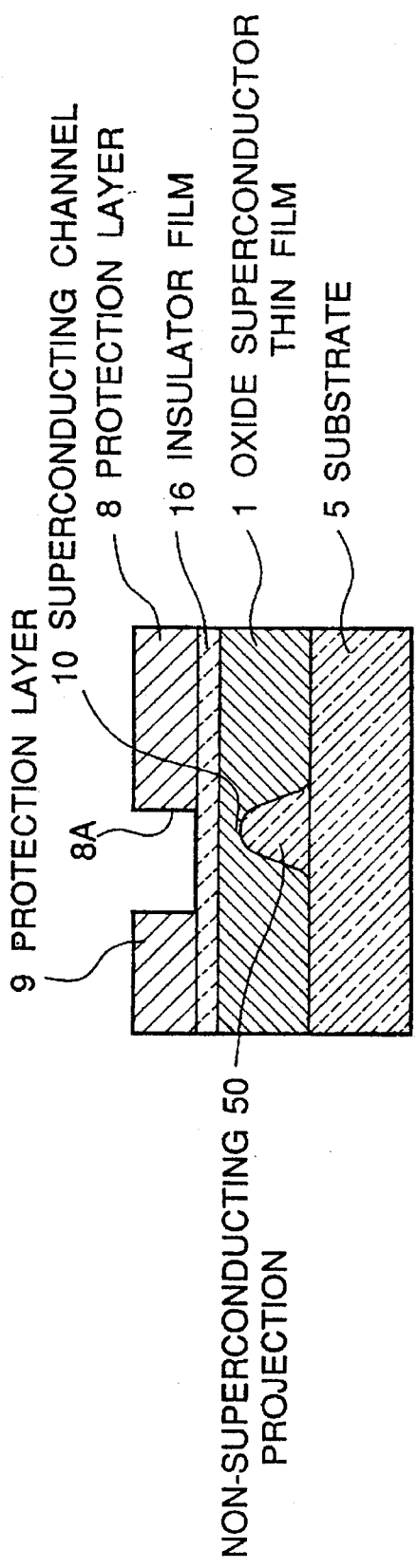

Thereafter, as shown in FIG. 2D, an insulator film 16 is formed on the oxide superconductor thin film 1, and then, surface protection insulating layers 8 and 9 are formed on the insulator film 16, excluding a limited region above the superconducting channel 10. The insulating layer 16 is preferably formed of an insulating material such as MgO, which does not form a large density of energy levels between the superconductor thin film 1 and the insulating layer 16. In addition, the insulating layer 16 has a thickness sufficient to prevent a tunnel current, for example, a thickness of not less than 10 nanometers. The surface protection insulating layers 8 and 9 are preferably formed of MgO.

Figure 2E:
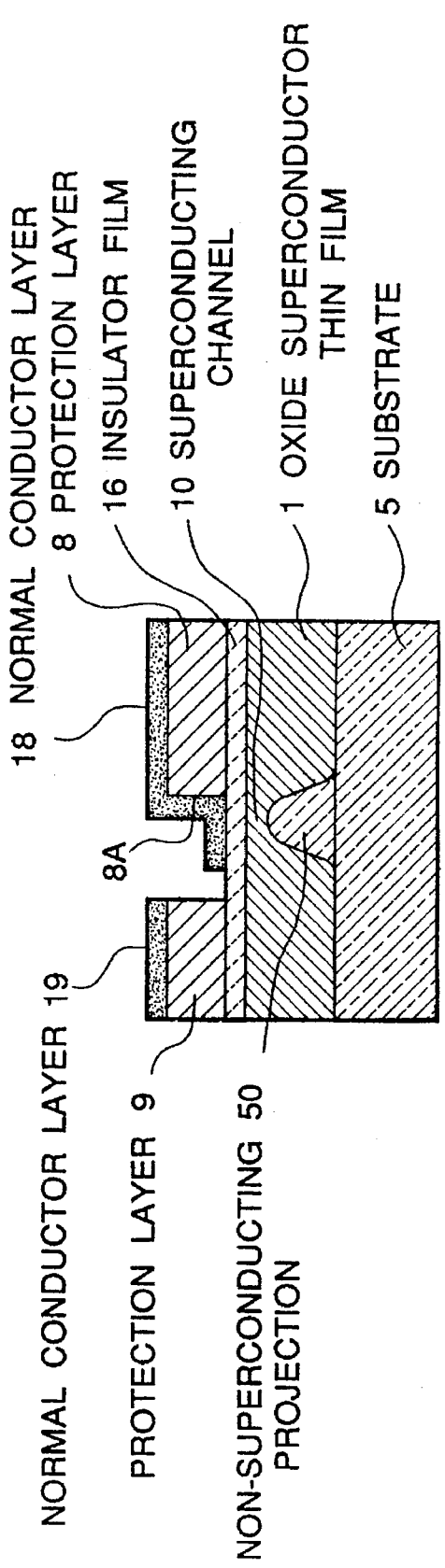

As shown in FIG. 2E, a normal conductor film 18 is formed on the surface protection layer 8 by performing an evaporation in an inclined direction so as to ensure that the normal conductor film 18 is deposited on a side surface 8A of the surface protection layer 8 positioned above the superconducting channel 10. In this process, another normal conductor film 19 is simultaneously formed on the surface protection layer 9. However, this normal conductor film 19 is not necessary. These normal conductor films 18 and 19 are preferably formed of a refractory metal such as Ti, W, etc., or Au, or a silicide thereof.

Figure 2F:
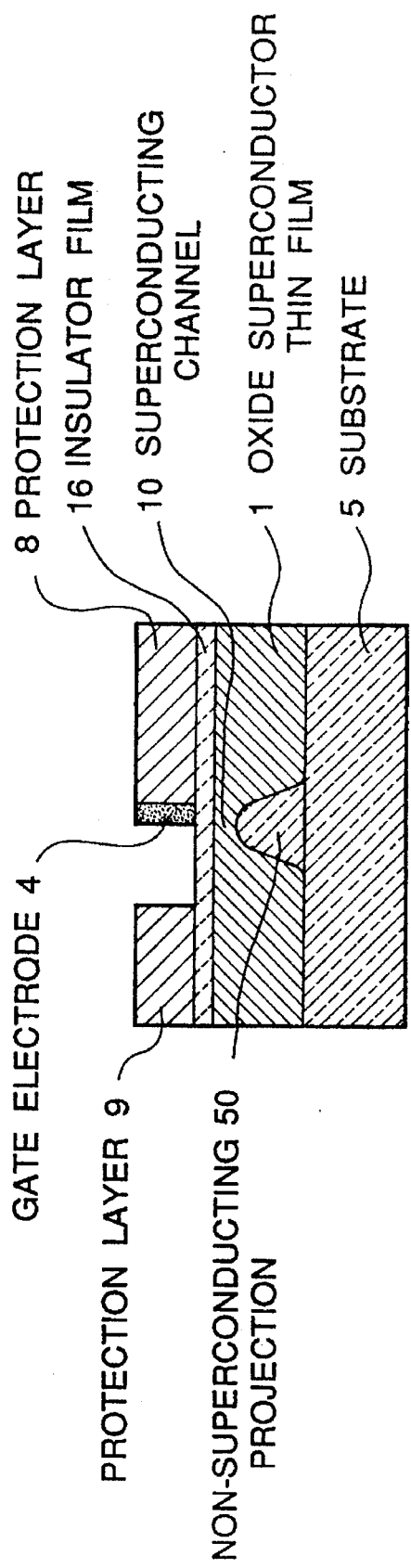

Then, as shown in FIG. 2F, an anisotropic etching is conducted on the normal conductor films 18 and 19 by means of a reactive ion etching, or an Ar-ion milling, so that a portion of the normal conductor film 18 remains only on the side surface 8A of of the surface protection layer 8. This remaining normal conductor film 18 forms a gate electrode 4. This gate electrode 4 is preferred to have a thickness of not greater than 100 nm.

Figure 2G:
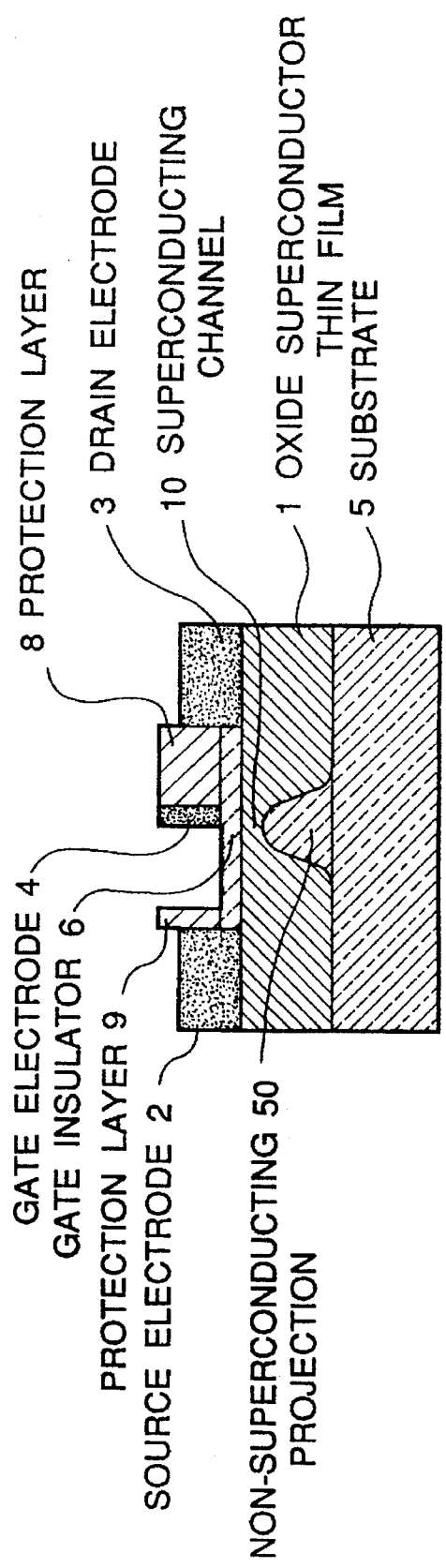

Finally, as shown in FIG. 2G, the insulator film 16 and the surface protection layers 8 and 9 are removed from opposite end regions of the oxide superconductor thin film 1. Therefore, the insulator film 16 remaining above the superconducting channel 10 forms a gate insulator layer 6. On the other hand, a source electrode 2 and a drain electrode 3 are formed on the opposite exposed end regions of the oxide superconductor thin film 1. The source electrode 2 and the drain electrode 3 are formed of the same normal conductor material as that of the gate electrode. Thus, the superconducting channel-FET is completed.

In the above mentioned embodiment, the non-superconducting region 50 is formed by diffusing the constituent element(s) of the substrate into the oxide superconductor thin film 1. The present invention is not limited to this method. For example, in the case of manufacturing the superconducting device as shown in FIG. 1B, the substrate is previously machined or etched so as to have a projection corresponding to the non-superconducting region 50, and then, the oxide superconductor thin film 1 is deposited on the substrate surface having the projection, and thereafter, is planarized so that the oxide superconductor thin film 1 has an flat upper surface.

In the above mentioned embodiment, the gate electrode is formed of a normal conductor, but can be formed of an oxide superconductor. In the latter case, after the insular film 16 is formed, an oxide superconductor thin film which has a thickness of not greater than 100 nm and which is preferably an a-axis oriented film, is deposited, and then, the Ar-ion milling and the anisotropic etching are performed in an inclined direction so as to shape a superconducting gate electrode. Thereafter, the protection layers 8 and 9 are formed.

Embodiment 2

Referring to FIG. 3K, there are shown diagrammatic sectional views of a second embodiment of the superconducting device in accordance with the present invention. In FIG. 3K, elements similar to those shown in FIGS. 1A to 2G are given the same Reference Numerals.

The superconducting device shown in FIG. 3K includes a gate insulator layer 6 and an oxide superconductor thin film 1 formed in the named order on a substrate 5 having a superconducting gate electrode 4 embedded therein. A surface protection layer 7 is formed on a portion of the oxide superconductor thin film 1 above the superconducting gate electrode 4. A source electrode 2 and a drain electrode 3 are formed on the oxide superconductor thin film 1 at both sides of the surface protection layer 7, respectively.

The oxide superconductor thin film 1 is formed of a c-axis oriented oxide superconductor crystal layer having a thickness of not greater than about five nanometers, so that a portion of the oxide superconductor thin film 1 above the embedded superconducting gate electrode 4 forms the superconducting channel 10. The gate insulator layer 6 is preferably formed of an insulating material such as MgO, $Si_3N_4$, and has a thickness sufficient to prevent a tunnel current, for example, a thickness of not less than 10 nanometers. The superconducting gate electrode 4 is formed of an a-axis oriented oxide superconductor crystal layer and has a thickness of not greater than about 100 nm in a direction of an electric current flowing through the superconducting channel 10.

Now, a process for manufacturing the superconducting device shown in FIG. 3K will be described with reference to FIGS. 3A to 3K.

Figure 3A:
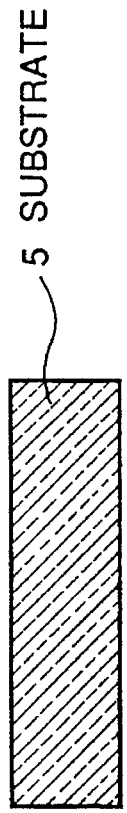

First, a substrate 5 is prepared as shown in FIG. 3A. Similarly to the first embodiment, this substrate 5 is formed of for example, an insulating substrate such as a MgO (100) substrate, a $SrTiO_3$ (100) substrate or others, or a semiconductor substrate such as a silicon (100) substrate having a principal surface coated with an insulating film. However, if the silicon substrate is used, the silicon substrate is coated with an insulating film after a step explained hereinafter is formed.

Figure 3B:
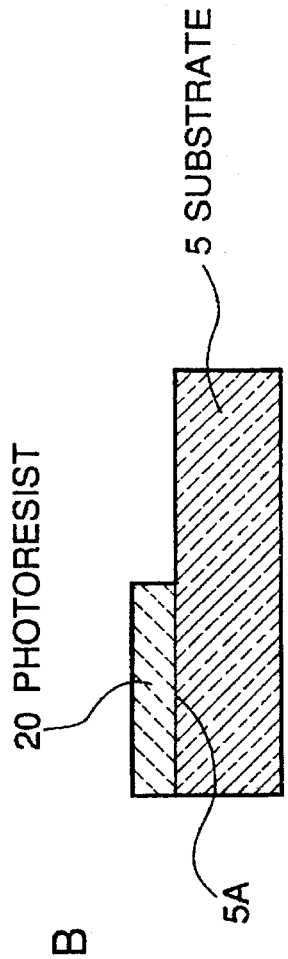
Figure 3C:
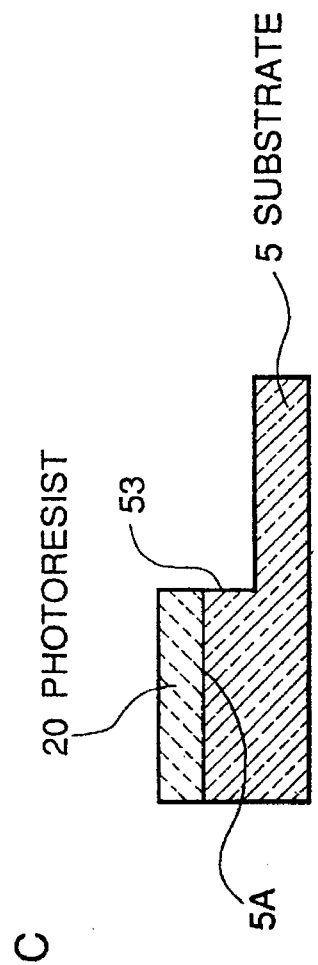

As shown in FIG. 3B, a photoresist 20 is deposited and patterned to cover a portion 5A of the substrate, and then, an uncovered portion of the substrate 5 is etched by a dry etching such as a reactive ion etching and an Ar-ion milling, so that a step 53 is formed as shown in FIG. 3C. Thereafter, the photoresist 20 is removed.

In the case that a semiconductor substrate is used, a crystalline direction is important, and therefore, the process is modified. For example, if a silicon substrate is used, a photoresist mask 20 is formed so as to ensure that a gate length direction (a channel current direction) is perpendicular to a Si(110) plane. The silicon substrate partially masked with the photoresist 20 is etched with an etching liquid such as KOH or APW, so that a step 53 is formed as shown in FIG. 3C. After the photoresist mask 20 is removed, the principal surface having the step 53 is continuously coated with $MgAlO_4$ by a CVD (chemical vapor deposition) and with $BaTiO_3$ by a sputtering process.

Figure 3D:
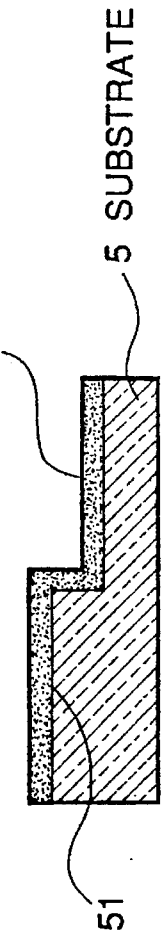

Then, as shown in FIG. 3D, an a-axis oxide superconductor thin film 11 having a thickness of not greater than 100 nm is deposited on the principal surface of the substrate 5 at a substrate temperature of not greater than 650° C., by for example an off-axis sputtering, a reactive evaporation, an MBE (molecular beam epitaxy), a CVD, etc. The oxide superconductor material is preferably formed of, for example, a Y-Ba-Cu-O type compound oxide superconductor material, a Bi-Sr-Ca-Cu-O type compound oxide superconductor material, and a Tl-Ba-Ca-Cu-O type compound oxide superconductor material. The a-axis orientated thin film has a large critical current density in a direction perpendicular to the substrate surface.

Figure 3E:
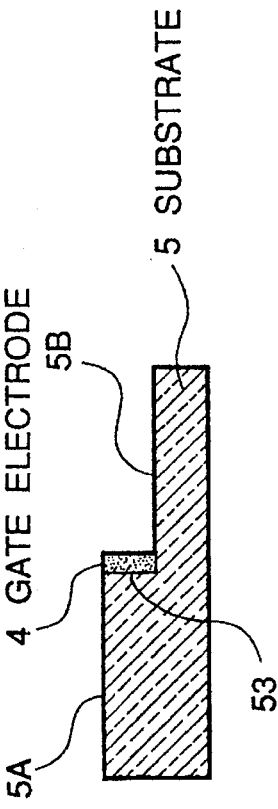

The oxide superconductor thin film 11 is selectively removed from a projected portion 5A and a recessed portion 5B of the substrate surface by an anisotropic etching such as a reactive ion etching, so that a superconducting gate electrode 4 is formed on only a side surface of the step 53 as shown in FIG. 3E.

Figure 3F:
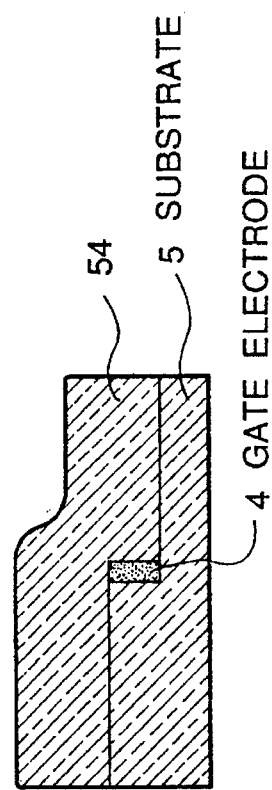
Figure 3G:
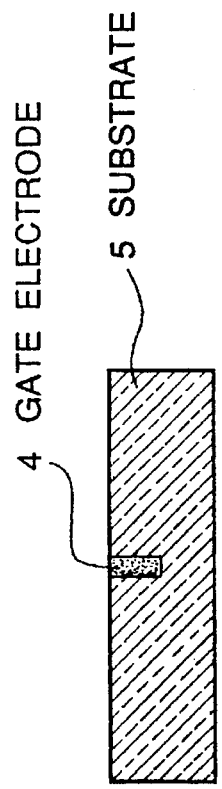

The same material as that of the substrate 5 is deposited by sputtering so that a layer 54 having a thickness sufficient to perfectly fill the recessed portion 5B, as shown in FIG. 3F. In addition, a photoresist (not shown) is deposited to cover the layer 54 and to have a flat upper surface. Thereafter, as shown in FIG. 3G, the photoresist on the layer 50 and the layer 50 itself are etched backed and planarized by the Ar-ion etching until an upper end of the superconducting gate electrode 4 is exposed.

Figure 3H:
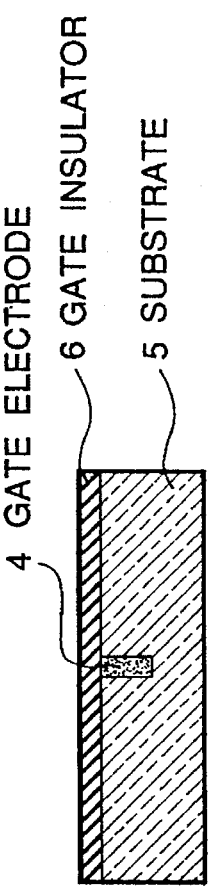

As shown in FIG. 3H, a gate insulator layer 6 is formed on the planarized surface of the substrate 5. This gate insulator layer 6 is preferably formed of an insulating material such as MgO, which does not form a large density of energy levels between the oxide superconductor thin film and the gate insulator layer 6. In addition, the gate insulator layer 6 has a thickness sufficient to prevent a tunnel current, for example, a thickness of not less than 10 nanometers.

As shown in FIG. 3I, a c-axis oxide superconductor thin film 1 having a thickness of not greater than five nanometers is deposited on the gate insulator layer 6. This c-axis oxide superconductor thin film 1 can be formed at a substrate temperature of about 700° C., by for example an off-axis sputtering, a reactive evaporation, the MBE, the CVD, etc. The c-axis orientated thin film has a large critical current density in a direction in parallel to the substrate surface.

As shown in FIG. 3J, a surface protection layer 17 is deposited to cover the whole of the oxide superconductor thin film 1. Thereafter, the surface protection layer 17 is selectively removed so that the surface protection layer 17 remains only above the superconducting gate electrode 4. A source electrode 2 and a drain electrode 3 are formed on the oxide superconductor thin film 1 at both sides of the remaining surface protection layer 7. The source electrode 2 and the drain electrode 3 are formed of a normal conductor, for example, a refractory metal such as Ti, W, etc., or Au, or a silicide thereof, or an oxide superconducting material.

Embodiment 3

Figure 4A:
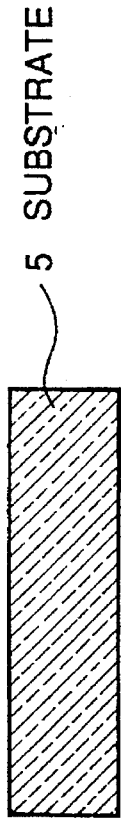
Figure 4B:
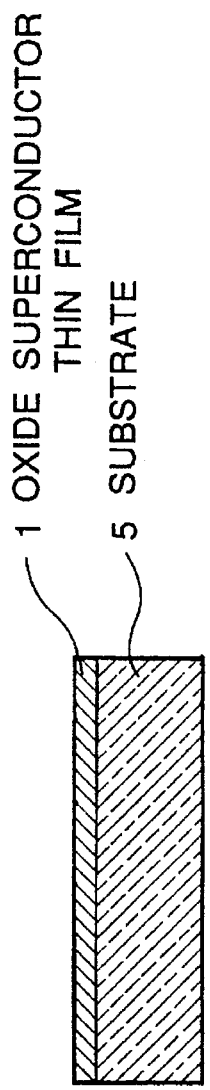
Figure 4C:
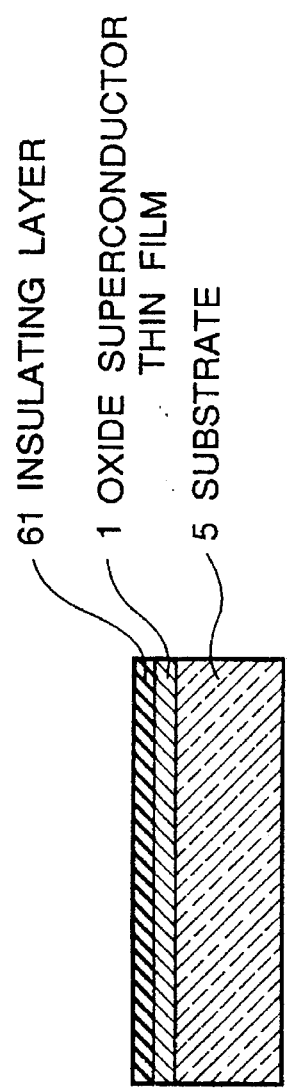
Figure 4D:
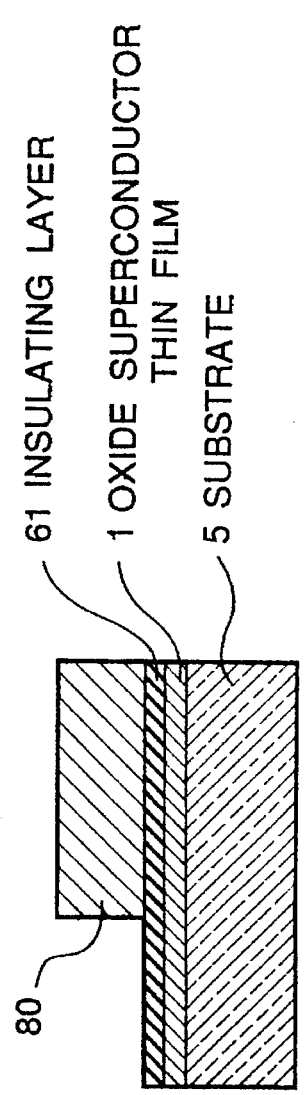
Figure 4E:
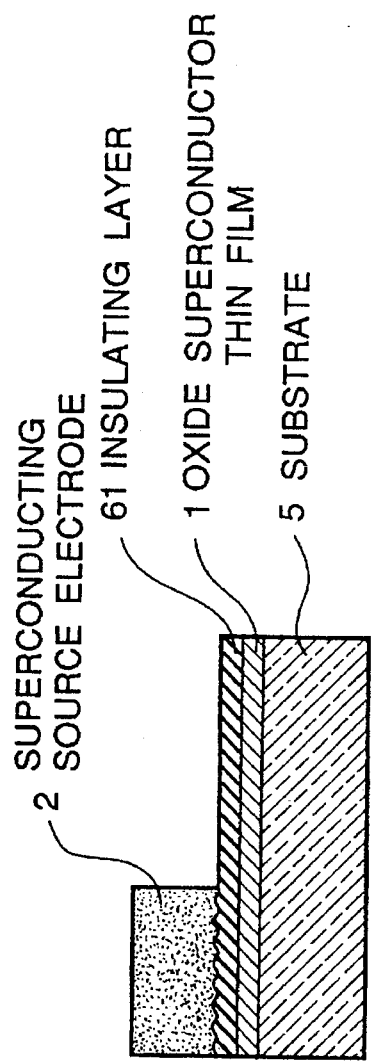
Figure 4F:
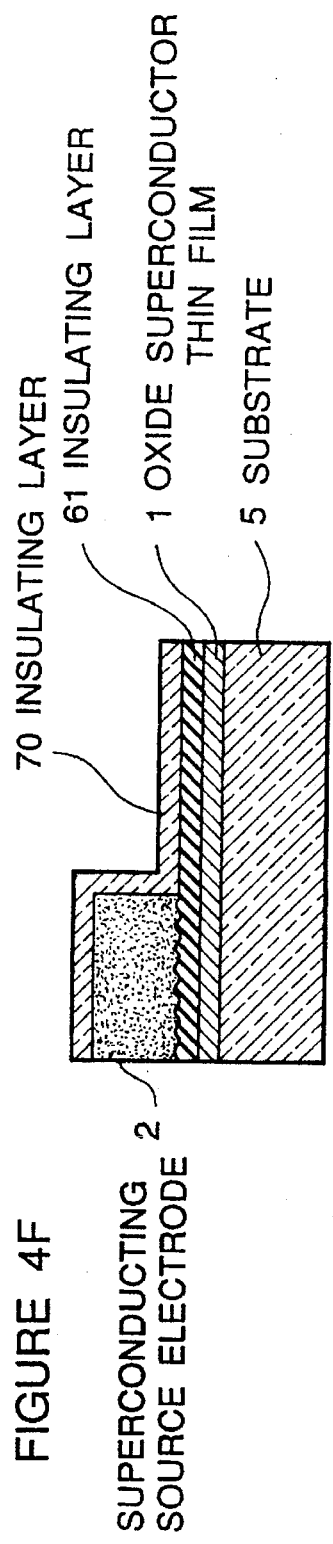
Figure 4G:
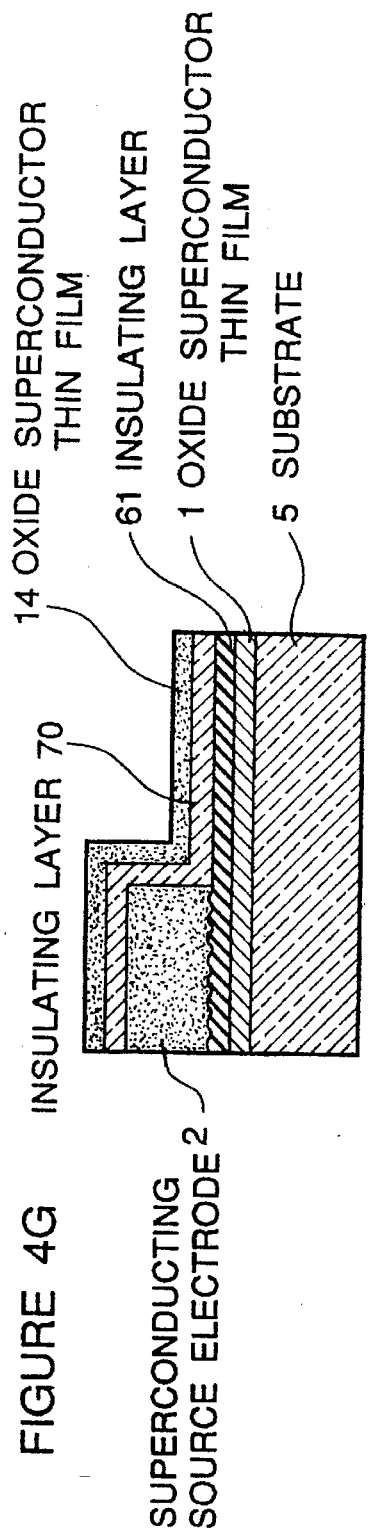
Figure 4K:
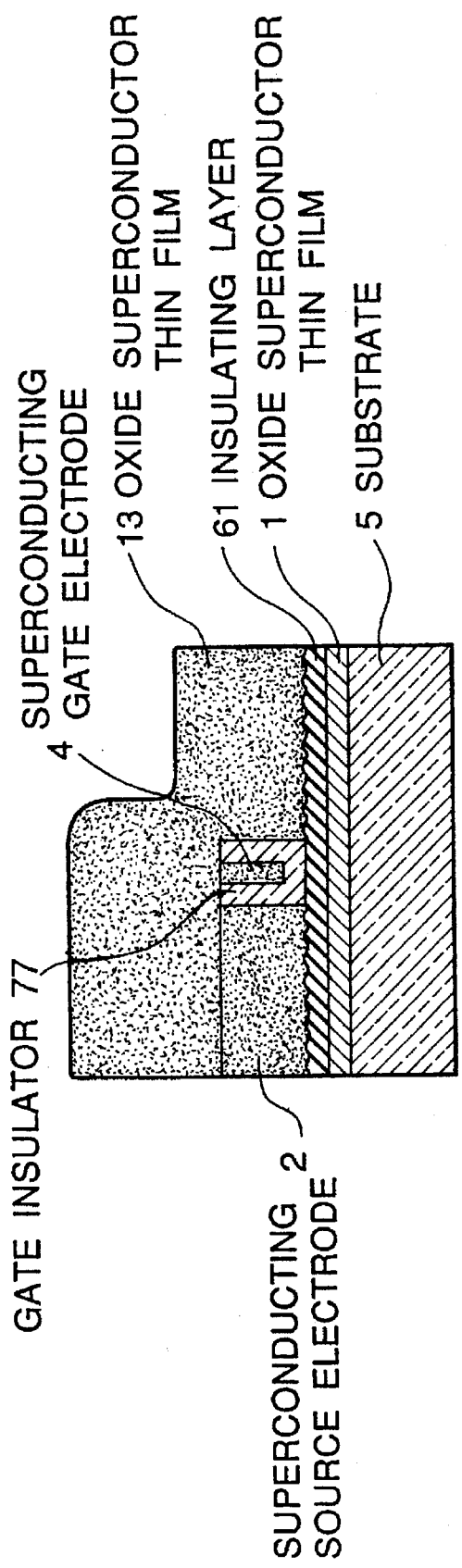
Figure 4L:
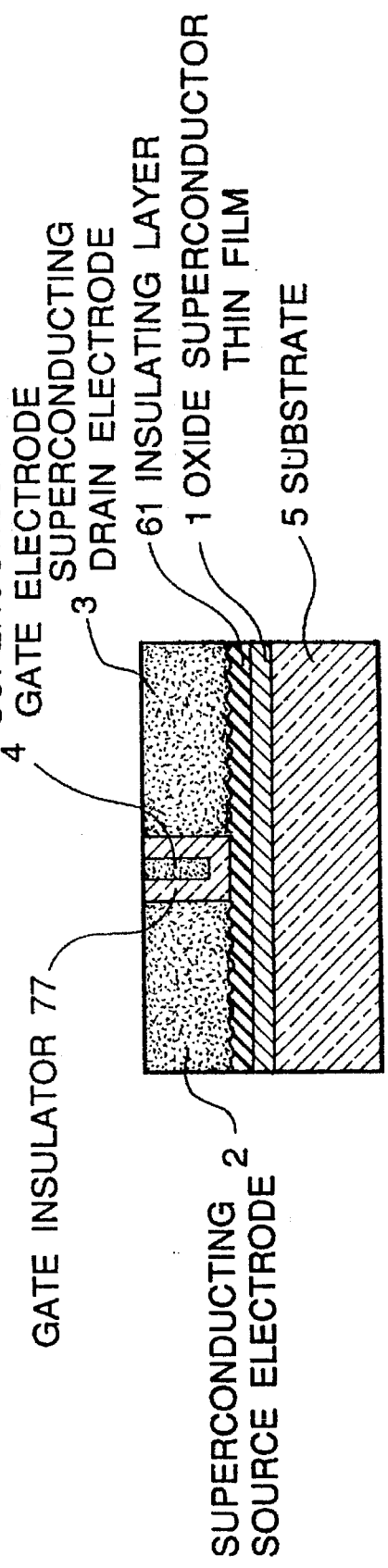

Referring to FIG. 4L, there are shown diagrammatic sectional views of a third embodiment of the superconducting device in accordance with the present invention. In FIG. 4L, elements similar to those shown in FIGS. 1A to 3K are given the same Reference Numerals.

The superconducting device shown in FIG. 4L includes an oxide superconductor thin film 1 deposited on a substrate 5 so as to form a superconducting channel. An insulating layer 61 is formed on the oxide superconductor thin film 1 above the superconducting gate electrode 4. A superconducting source electrode 2 and a superconducting drain electrode 3 are formed on both end portions of the insulating layer 61, respectively. On a central portion of the insulating layer 61, there is located a superconducting gate electrode 4 surrounded by an insulating layer 77.

The substrate 5 is formed of for example, an insulating substrate such as a MgO (100) substrate, a SrTiO$_3$ (100) substrate, a CdNdAlO$_4$ (100) substrate or others. The oxide superconductor thin film 1 is formed of a c-axis oriented oxide superconductor crystal layer having a thickness of not greater than about five nanometers, and on the other hand, the superconducting source electrode 2 and the superconducting drain electrode 3 are formed of an a-axis oriented oxide superconductor crystal layer having a thickness of about 200 nm. The superconducting gate electrode 4 is similarly formed of an a-axis oriented oxide superconductor crystal layer and has a thickness of not greater than about 100 nm in a direction in parallel to the oxide superconductor thin film 1. The insulating layer 77 surrounding the superconducting gate electrode 4 is preferably formed of an insulating material such as MgO, Si$_3$N$_4$, and has a thickness sufficient to prevent a tunnel current, for example, a thickness of not less than 10 nanometers.

The insulating layer 61 is formed of a MgO film having a thickness of not greater than 10 nanometers. In a portion of the insulating layer 61 under each of the superconducting source electrode 2 and the superconducting drain electrode 3, MgO flocculates so that the oxide superconductor thin film 1 is in electric connection with the superconducting source electrode 2 and the superconducting drain electrode 3, respectively.

Now, a process for manufacturing the superconducting device shown in FIG. 4L will be described with reference to FIGS. 4A to 4L.

First, a substrate 5 is prepared as shown in FIG. 4A. Similarly to the first embodiment, this substrate 5 is formed of for example, an insulating substrate such as a MgO (100) substrate, a SrTiO$_3$ (100) substrate or others, or a semiconductor substrate such as a silicon (100) substrate having a principal surface coated with an insulating film. For example, if the silicon substrate is used, a principal surface of the silicon substrate is continuously coated with MgAl$_2$O$_4$ by a CVD process and with BaTiO$_3$ by a sputtering process.

Then, as shown in FIG. 4B, a c-axis oxide superconductor thin film 1 having a thickness of not greater than five nanometers is deposited on the substrate 5. This c-axis oxide superconductor thin film 1 can be formed by for example an off-axis sputtering, a reactive evaporation, the MBE, the CVD, etc. The c-axis orientated thin film has a large critical current density in a direction in parallel to the substrate surface.

For example, the oxide superconductor thin film 1 can be formed by an off-axis sputtering which is performed under the condition that a sputtering gas is composed of Ar and O$_2$ at the ratio of Ar:O$_2$=9:1, the sputtering gas pressure is 10 Pa, and the substrate temperature is 700° C.

Then, an insulating layer 61 is formed on the oxide superconductor thin film 1, as shown in FIG. 4C. The thickness of the insulating layer 61 is made to be not greater than ten nanometers. The insulating layer 61 is formed of an insulating material such as MgO, which can realize an electric connection due to flocculation.

As shown in FIG. 4D, a sublimation type resist layer 80 of for example Mo is formed on a right half (in the drawing) of the insulating layer 61, by a vacuum evaporation process.

As shown in FIG. 4E, an a-axis oxide superconductor thin film having a thickness of about 200 nm is deposited on a portion of the insulating layer 61 which is not covered by the resist layer 80, so that a superconducting source electrode 2 is formed. This a-axis oxide superconductor thin film can be formed by for example an off-axis sputtering, a reactive evaporation, the MBE, the CVD, etc., and at a substrate temperature of not greater than 650° C.

For example, the oxide superconductor thin film for the superconducting source electrode 2 can be formed by an off-axis sputtering which is performed under the condition that a sputtering gas is composed of Ar and O$_2$ at the ratio of Ar:O$_2$=9:1, the sputtering gas pressure is 10 Pa, and the substrate temperature is 640° C.

In a portion of the insulating layer 61 under the superconducting source electrode 2, MgO flocculates, so that an electrical connection is formed between the oxide superconductor thin film 1 and the superconducting source electrode 2. In the deposition process of the superconducting source electrode 2, on the other hand, the sublimation type resist layer 80 sublimates, so that the right half of the insulating layer 61 is exposed.

As shown in FIG. 4F, an insulating layer 70 such as MgO or Si$_3$N$_4$ is deposited to continuously and uniformly cover the superconducting source electrode 2 and the insulating layer 61. The insulating layer 70 cooperates with the insulating layer 61 so as to form a gate insulator layer, and therefore, the insulating layer 70 is made to have a thickness of not greater than ten nanometers in order to prevent a tunnel current.

Thereafter, as shown in FIG. 4G, an oxide superconductor thin film 14 is deposited on the insulating layer 70. This oxide superconductor thin film 14 is formed of an a-axis oriented oxide superconductor crystal layer having a thickness of not greater than about 100 nm. This oxide superconductor thin film 14 can be formed by an off-axis sputtering similarly to the superconducting source electrode 2 by maintaining the substrate temperature not greater than 650° C.

As shown in FIG. 4H, the oxide superconductor thin film 14 and the insulating layer 70 are anisotropically etched by a reactive ion etching, an Ar-ion milling or other suitable means, so that the oxide superconductor thin film 14 and the insulating layer 70 are left on only a side surface of the superconducting source electrode 2. The remaining superconductor thin film 14 forms a superconducting gate electrode 4. On the other hand, an etching is performed so that the right half portion of the insulating layer 61 is exposed again.

As shown in FIG. 4I, an insulating layer 72 is deposited to continuously and uniformly cover the superconducting source electrode 2, the remaining insulating layer 70, the superconducting gate electrode 4 and an exposed surface of the insulating layer 61. The insulating layer 72 is formed of the same material as that of the insulating layer 70.

As shown in FIG. 4J, the insulating layer 70 is anisotropically etched by a reactive ion etching, an Ar-ion milling or other suitable means, so as to finish the superconducting gate electrode 4 surrounded by the insulating layer 77. An etching is performed so that the right half portion of the insulating layer 61 is exposed again.

As shown in FIG. 4K, an oxide superconductor thin film 13 is deposited to continuously and uniformly cover the superconducting source electrode 2, the insulating layer 77, the superconducting gate electrode 4 and an exposed surface of the insulating layer 61. This oxide superconductor thin film 13 is formed of an a-axis oriented oxide superconductor crystal layer having a thickness of not greater than about 200 nm. This oxide superconductor thin film 13 can be formed by an off-axis sputtering similarly to the superconducting gate electrode 4 by maintaining the substrate temperature not greater than 650° C. At a boundary between the insulating layer 61 and the oxide superconductor thin film 13, MgO flocculates, so that an electrical connection is formed between the oxide superconductor thin film 1 and the oxide superconductor thin film 13.

Thereafter, a photoresist is deposited to cover the oxide superconductor thin film 13 and to have a flat upper surface, and etched back and planarized until the upper end surface of the superconducting gate electrode 4 is exposed as shown in FIG. 4L.

As explained above, in the superconducting device in accordance with the present invention, a main current flows through the superconducting channel and is controlled by the gate voltage. Therefore, differently from the conventional super-FET in which a superconducting current flows through the semiconductor channel due to the superconducting proximity effect, the fine processing techniques which had been required for manufacturing the super-FET have become unnecessary. In addition, since it is not necessary to stack the superconductor and the semiconductor, high performance superconducting device can be realized by using an oxide superconductor. Furthermore, since the gate length can be shortened, the superconducting device in accordance with the present invention can operate at a high speed. Therefore, the application of the superconduction technology to the electronic devices can be promoted.

The invention has thus been shown and described with reference to the specific embodiments. However, it should be noted that the present invention is in no way limited to the details of the illustrated structures but changes and modifications may be made within the scope of the appended claims.

We claim:

1. A method for manufacturing a superconducting three-terminal device, comprising the step of forming on a substrate an oxide superconductor thin film having a planar upper surface, depositing a gate insulator layer on said planar upper surface of said oxide superconductor thin film, forming on said gate insulator layer at least one protection layer having an end surface positioned above a channel region of said superconducting thin film, and depositing on said end surface of said at least one insulating protection layer a thin film of a conducting material so that said deposited thin film of said conducting material forms a gate electrode in the form of a thin film having a lower end in contact with said gate insulator layer.

2. A method for manufacturing a superconducting field effect transistor, comprising the steps of depositing an oxide superconductor thin film on a substrate having a stepped portion, selectively removing the deposited oxide superconductor thin film from the substrate so as to leave the deposited oxide superconductor thin film on only the side surface of said stepped portion, filling a material into a recess formed by said stepped portion so that a planar upper surface is formed on said substrate and an upper end of the remaining oxide superconductor thin film deposited on said stepped portion is exposed on said planar upper surface, forming a gate insulator layer on said planar upper surface, forming a superconducting channel layer on said gate insulator layer, and forming a source electrode and a drain electrode on said superconducting channel layer.

3. A method for manufacturing a superconducting three terminal device, comprising the steps of forming an oxide superconductor thin film on a substrate, depositing an extremely thin insulator layer on said oxide superconductor thin film, forming on a portion of said gate insulator layer, a source electrode having an end surface substantially perpendicular to said substrate so that said source electrode is in electrical connection with said oxide superconductor thin film because of flocculation generated in said extremely thin insulator layer, depositing on said end surface of said source electrode a gate electrode in the form of a thin film surrounded by a gate insulator layer in such a manner that a plane of the thin film of said gate electrode is substantially perpendicular to said substrate, and forming on said extremely thin insulator layer a drain electrode adjacent to said gate insulator layer surrounding said gate electrode in the form of a thin film so that said drain electrode is in electrical connection with said oxide superconductor thin film because of flocculation generated in said extremely thin insulator layer.

* * * * *